US012662372B2

(12) United States Patent
Melnikov et al.

(10) Patent No.: US 12,662,372 B2
(45) Date of Patent: Jun. 23, 2026

(54) MICROELECTROMECHANICAL DEVICE AND MICROELECTROMECHANICAL LOUDSPEAKER

(71) Applicant: Robert Bosch GmbH, Stuttgart (DE)

(72) Inventors: Anton Melnikov, Dresden (DE); Jens Schindele, Kirchentellinsfurt (DE)

(73) Assignee: ROBERT BOSCH GMBH, Stuttgart (DE)

( * ) Notice: Subject to any disclaimer, the term of this patent is extended or adjusted under 35 U.S.C. 154(b) by 129 days.

(21) Appl. No.: 18/739,403

(22) Filed: Jun. 11, 2024

(65) Prior Publication Data

US 2024/0425358 A1     Dec. 26, 2024

(30) Foreign Application Priority Data

Jun. 26, 2023    (DE) ..................... 10 2023 205 989.4

(51) Int. Cl.
B81B 3/00         (2006.01)

(52) U.S. Cl.
CPC .... B81B 3/0072 (2013.01); B81B 2201/0257 (2013.01); B81B 2203/0127 (2013.01); B81B 2203/0172 (2013.01); B81B 2207/053 (2013.01)

(58) Field of Classification Search
CPC .............................. B81B 3/0072; H04R 19/04
See application file for complete search history.

(56) References Cited

U.S. PATENT DOCUMENTS

| | | | |
|---|---|---|---|
| 11,770,659 B2 * | 9/2023 | Kaiser ..................... | H04R 3/00 |
| | | | 381/111 |
| 2012/0018244 A1 | 1/2012 | Robert | |
| 2020/0087138 A1 * | 3/2020 | Schenk ............... | H04R 19/005 |
| 2021/0297787 A1 | 9/2021 | Lo et al. | |
| 2023/0406694 A1 * | 12/2023 | Bretthauer ............. | G10K 15/04 |

FOREIGN PATENT DOCUMENTS

| | | |
|---|---|---|
| DE | 102015210919 A1 | 12/2016 |
| DE | 102019203914 B3 | 7/2020 |
| GB | 2554470 A | 4/2018 |
| WO | 2021144400 A1 | 7/2021 |
| WO | 2021223886 A1 | 11/2021 |

* cited by examiner

*Primary Examiner* — Paul W Huber
(74) *Attorney, Agent, or Firm* — NORTON ROSE FULBRIGHT US LLP

(57)         ABSTRACT

A microelectromechanical device for generating a fluid pressure. The microelectromechanical device includes a displacement structure, wherein the displacement structure has a movable membrane which can be deflected to generate the fluid pressure by means of a drivable connection structure acting on the membrane, and wherein the connection structure has a drive element and a deflection element connecting the membrane to the drive element. The deflection element has a lower flexural rigidity than the drive element and is elastically deformable when the membrane is deflected. A microelectromechanical loudspeaker having such a microelectromechanical device is also described.

15 Claims, 13 Drawing Sheets

MICROELECTROMECHANICAL DEVICE AND MICROELECTROMECHANICAL LOUDSPEAKER

CROSS REFERENCE

The present application claims the benefit under 35 U.S.C. § 119 of German Patent Application No. DE 10 2023 205 989.4 filed on Jun. 26, 2023, which is expressly incorporated herein by reference in its entirety.

FIELD

The present invention relates to a microelectromechanical device and a microelectromechanical loudspeaker.

BACKGROUND INFORMATION

Microelectromechanical devices and loudspeakers, also known as microelectromechanical structures under the term "MEMS," are described, for example, in U.S. Patent Application Publication No. US 2021/0297787 A1 which describes a sound generation chip having a membrane, a coupling plate and a spring structure, as well as an actuator for exciting the membrane.

PCT Patent Application No. WO 2021/144400 A1 describes a MEMS transducer comprising an oscillatable membrane having vertical portions that can be excited to oscillate horizontally.

PCT Patent Application No. WO 2021/223886 A1 relates to a MEMS having a layer structure and a cavity arranged therein, in which an interaction structure movably arranged along a plane direction is formed.

German Patent Application No. DE 10 2019 203 914 B3 describes a MEMS having a movable layer arrangement in a cavity, which is moved along a substrate plane by an electrical potential between two of three bars arranged in the layer arrangement.

U.S. Patent Application Publication No. US 2012/0018244 A1 relates to a MEMS loudspeaker having a cavity delimited by a membrane and an actuator for displacing or deforming the membrane in order to generate a pressure pulse.

Great Britain Patent No. GB 2 554 470 A describes a MEMS device having a primary membrane firmly attached to a substrate and a secondary membrane in a plane above the primary membrane, wherein the secondary membrane is mechanically coupled to the primary membrane.

SUMMARY

According to the features of the present invention, a microelectromechanical device for generating a fluid pressure having a displacement structure is provided. According to an example embodiment of the present invention, the displacement structure has a movable membrane which can be deflected to generate the fluid pressure by means of a drivable connection structure acting on the membrane, and wherein the connection structure has a drive element and a deflection element connecting the membrane to the drive element, wherein the deflection element has a lower flexural rigidity than the drive element and is elastically deformable when the membrane is deflected.

In other words, a flexible, reversibly deformable deflection element for deflecting the membrane is provided, which allows the connection structure to be flexibly coupled to the membrane so that stiffening of the membrane can be avoided, and material stress on the membrane can be reduced. The deflection element of the connection structure is designed to be yielding or flexible in such a way that a twisting of the membrane during its deflection is transferred to the deflection element, and the deflection element is thereby elastically deformed. The deflection element can be elastically deformable, in particular in an arc shape. The arched deformation in this case is due to the twisting of the membrane during its deflection and can also be simply referred to as the twisting of the deflection element. Elastic deformability is understood to mean reversible deformability in which the deflection element strives to return to its original shape after the deflected membrane has returned to its starting position and therefore after the membrane twisting causing the deformation has ceased. The original shape can be, for example, a straight, elongate course of the deflection element.

The connection structure of the device is designed to deflect the membrane in order to generate a fluid pressure. In the present application, a connection structure is understood to mean a movable actuator element which is part of an actuator system having a drive apparatus and the connection structure which can be driven by the drive apparatus. The connection structure serves to transmit power from a drive apparatus to the membrane. The connection structure can represent a so-called shuttle. The drive element of the connection structure is the part of the connection structure that is driven by the drive apparatus so that the drive element is moved along a predefined path of movement in a direction of movement. The drive apparatus can be designed to be able to drive the connection structure in opposite directions of movement in order to be able to deflect the membrane in opposite directions. The drive apparatus can be, for example, an electrostatic, piezoelectric or other suitable drive apparatus, wherein the drive concept can be based, for example, on comb structures, electrostatic bending actuators (nanoscopic electrostatic drive, NED) or micro muscles. The deflection element is connected to the drive element and is the part of the connection structure that transfers the drive force of the drive apparatus to the membrane via a movement of the drive element and the deflection element. In the context of the present application, the term "connected" can refer in particular to an integral connection without additional form-fitting, force-fitting or integrally bonded connecting means. Due to the elastically deformable design of the deflection element, the drive force is transferred to the membrane in such a way that a deflection of the membrane leads to an arched deformation of the deflection element, and stiffening of the membrane is avoided.

The membrane can be a flat, deflectable structure having a height and length several times greater than the width, wherein the height and length span a membrane plane which can be aligned in particular vertically in the displacement structure. The membrane can, for example, have a width between 0.5 and 100 μm, in particular between 1 and 30 μm. The membrane can, for example, have a length between 100 and 10,000 μm, in particular between 1,000 and 5,000 μm. The membrane can, for example, have a height between 1 and 1,000 μm, in particular between 50 and 800 μm. In particular, the connection structure can be moved substantially in a drive direction perpendicular to the membrane plane in order to deflect the membrane. A membrane deflection usually leads to at least local or partial twisting of the membrane.

According to an example embodiment of the present invention, it is proposed that the flexural rigidity of the deflection element is lower than the flexural rigidity of the drive element. In the context of the present application, flexural rigidity is understood to be the product of a modulus of elasticity E and area moment of inertia I. Here, the modulus of elasticity E is to be understood as the effective modulus of elasticity, since the components of the displacement structure of the device can be made of anisotropic silicon, and therefore fluctuations of the local modulus of elasticity can occur. Suitable or favorable value ranges of the effective modulus of elasticity can be, for example, between 1 GPa and 400 GPa, in particular in a range between 120 GPa and 200 GPa.

In principle, it is possible to influence the flexural rigidity by different materials and therefore different moduli of elasticity of the drive element and the deflection element. However, since the deflection element and the drive element can advantageously be made of the same material or at least of similar materials, in particular semiconductor materials, the reduced flexural rigidity can be influenced in particular via the geometric shape and design of the deflection element in order to reduce its area moment of inertia. For example, the deflection element can be designed as a thin fin with a width several times smaller in comparison to the drive element. The deflection element can, for example, have a width between 0.5 and 100 μm, in particular between 1 and 50 μm. In this case, the deflection element can be made of solid material. Alternatively or additionally, it is possible to provide the deflection element with a structure, for example with a micro-perforation, in order to specifically reduce the flexural rigidity of the deflection element.

The drive element has a higher flexural rigidity than the deflection element. In other words, the deflection element can be flexible, and the drive element can be rigid. This can prevent a potential transfer of twists of the deflection element or the membrane via the drive element to the drive apparatus, and makes possible a defined drive of the drive element with efficient power transmission. The higher flexural rigidity can be achieved in particular via the geometric shape and design of the drive element. The drive element can, for example, have a greater width than the deflection element, for example a width between 0.5 and 1500 μm, in particular between 50 and 500 μm. In other words, the connection structure can be rigid on the drive side and flexible on the output side, wherein the drive side can be assigned to a drive apparatus and the output side to the membrane. A height of the drive element and/or the deflection element can be, for example, between 0.5 and 600 μm, in particular between 5 and 60 μm.

The flexural rigidity of the drive element can be, for example, twice, three times or four times the flexural rigidity of the deflection element. According to one embodiment, the flexural rigidity of the drive element can be at least five times the flexural rigidity of the deflection element. In the case of an elastically deformable design of the deflection element, this can reliably prevent twists from being transferred to the drive apparatus via the drive element.

According to an example embodiment of the present invention, the displacement structure can also have a plurality of movable membranes. For example, a plurality of movable membranes can be at least two movable membranes. A movable membrane can enclose a displacement volume with another movable membrane and/or with a fixed structure, for example a holding structure such as a frame, so that a deflection of the membrane leads to a change in the displacement volume, and a fluid pressure is generated. The membranes can be, for example, arranged periodically one after the other in a holding structure.

According to an example embodiment of the present invention, if the displacement structure has a plurality of movable membranes, the connection structure can be designed as a multiple connection structure which is configured for the simultaneous deflection of a plurality of membranes. This allows the number of deflections per connection structure movement to be increased and promotes simultaneous and uniform fluid pressure generation across the displacement structure. In principle, a deflection element can protrude from the drive element on each membrane in order to connect the drive element to the membrane by means of the deflection element. However, it may also be advantageous if the deflection element extends at a distance from the drive element and is connected to the drive element at predefined intervals. This achieves an advantageous additional coupling of the membrane via the deflection element, which can contribute to increased stability of the displacement structure. In other words, the deflection element can run substantially parallel to the drive element in a non-deformed state, i.e., in a non-deflected state of the membranes. A deflection of, for example, periodically arranged membranes can lead to multiple arched deformations of the deflection element in the region of the membranes and therefore a periodic, wave-shaped deformation of the deflection element between the membranes can occur.

The deflection element can be connected to the membrane via a coupling point which is arranged between a membrane center and a membrane end. This can make possible a positive leverage effect, in which a small excitation of the deflection element can lead to a comparatively large deflection of the membrane. The coupling point can be, for example, located within a range of ¼ to ¾ of the distance between the membrane center and the membrane end. The coupling point can be, for example, located substantially centrally between the membrane center and the membrane end. For example, a membrane center can refer to a geometric center of the membrane. A membrane end may, for example, refer to an attachment region of the membrane to a holding structure. In the case of a membrane aligned vertically in the displacement structure, the connection of the deflection element can be made to a membrane edge delimiting the membrane, wherein the coupling point can lie in a portion of the membrane edge that lies between a central longitudinal axis of the membrane transverse to the membrane edge and the fastening region of the membrane to the holding structure. In a deflected state of the membrane, the coupling point can be arranged, for example, in an inflection point region of a curve described by the deflected membrane. The coupling point can, for example, have a height between 0.01 and 20 μm, in particular between 0.1 and 3 μm. A width and a thickness of a coupling point can be, for example, in each case between 0.5 and 100 μm, wherein the width can in particular be half of a width of the membrane, and wherein the thickness can in particular be half of a width of the deflection element.

According to one example embodiment of the present invention, the drive element is connected to the deflection element by means of a connection element. This allows a defined connection of the deflection element to the drive element. The connection element can be, for example, designed as a connecting piece extending between the drive element and the deflection element. According to one embodiment, the connection element can partially penetrate into a recess of the drive element. As a result, a compact embodiment of the connection structure can be provided.

According to one example embodiment of the present invention, the connection element can have a higher flexural rigidity than the deflection element. In other words, the connection element can be a rigid connection element. The connection element can, for example, have a smaller length and/or a larger width than the deflection element. The connection element can, for example, have a length between 0.5 and 500 μm, in particular between 6 and 100 μm, and, for example, a width between 0.5 and 100 μm, in particular between 1 and 30 μm. A higher flexural rigidity can prevent twists of the deflection element or the membrane from being transferred to the drive element.

A distance between two connection elements can be, for example, between 5 and 4500 μm, in particular between 10 and 200 μm. A distance between a coupling point and the nearest connection element can be, for example, between 5 and 4500 μm, in particular approximately ¼ of the distance between two connection elements. A distance between two coupling points can be, for example, between 5 and 4500 μm, in particular between 10 and 200 μm. A distance between two membranes can be, for example, between 5 and 4500 μm, in particular between 10 and 200 μm. According to one exemplary embodiment, the distances between two connection elements, between two coupling points and between two membranes can be substantially equal in size. A distance between a membrane end of a membrane and a coupling point on the same membrane can be, for example, between $0.01 \cdot (l_4/2)$–$0.99 \cdot (l_4/2)$, where $l_4$ corresponds to the length of a membrane.

According to one example embodiment of the present invention, two or more drive elements can also have at least one common deflection element and/or at least one common connection element. This makes it possible to achieve a stable and safe drive of the deflection element and a compact arrangement.

According to one example embodiment of the present invention, the deflection element can be elastically deformable in an arc shape, and the connection element can be connected to a neutral portion of the deflection element, wherein the neutral portion is a region of an arched deformation of the deflection element at which a tangent runs substantially parallel to the drive element. The arched deformation of the deflection element is related to a deflected state of the membrane. In other words, the deflection element runs approximately parallel to the drive element in the region of the neutral portion. Here, the expression "parallel to the drive element" refers to a longitudinal extension of the drive element which may, for example, be the greatest extension of the drive element and may run transversely to the membrane. Relative to a deflected state of the membrane and a deformed state of the deflection element, the twisting of the deflection element at the neutral portion is minimized. This ensures that no twists are transferred from the deflection element to the drive element. In addition, the connection element prevents the deflection element and therefore possibly also the membrane from being stiffened. The tangent can ideally be applied to a neutral point of the neutral portion in which the tangent runs parallel to the drive element. However, due to the extent of the connection element, it cannot be connected in a point-like manner, but occupies a certain region around the neutral point, which is referred to here as the neutral portion. The neutral portion of the deflection element can in particular be spaced from a coupling point of the deflection element to the membrane. If the displacement structure has a plurality of membranes and the deflection element extends at a distance from the drive element such that the deflection element is deformed in a wave-like manner between the membranes when the membranes are deflected, a sign change of the arched deformation of the deflection element by the membranes takes place along the wave shape. This means that there is at least one localized point with a twist equal to zero to which the connection element can be attached. In the case of a periodic arrangement of a plurality of membranes and a connection structure, the connection element can be, for example, connected to the deflection element at a position of ¼±15% or ¾±15% of the membrane distance. In principle, the connection can also be made to a neutral portion of the deflection element if the plurality of membranes are arranged non-periodically or the displacement structure has only a single membrane, wherein the position is selected here according to the individual membrane arrangement in such a way that the twisting of the deflection element at the connection point is minimized.

By connecting the deflection element to a neutral portion by means of a connection element, a deflection of the membrane and a deformation of the deflection element associated therewith can result in the connection element transferring a slight residual transverse movement of the deflection element to the drive element. If the deflection element is deformed, for example, by a momentary membrane deflection in such a way that a wave trough of the wave-shaped deformed deflection element is present in the connection element, the deflection element exerts a slight compressive force on the connection element which causes the aforementioned residual transverse movement. Conversely, the residual transverse movement can also result from a tensile force of a wave crest of the deflection element on the connection element. The residual transverse movement can be compensated for by the connection structure and/or the drive apparatus, as will be explained below in connection with further embodiments.

According to one example embodiment of the present invention, the connection element can have a lower flexural rigidity than the drive element. In other words, the connection element can be a flexible connection element. The connection element can be elastically deformable, in particular elastically deformable in an arc shape. The flexural rigidity of the connection element can, for example, substantially correspond to the flexural rigidity of the deflection element. The connection element can, for example, have a width between 0.5 and 100 μm, in particular between 1 and 50 μm.

According to one example embodiment of the present invention, the deflection element can be elastically deformed in an arc shape, and the connection element can be connected to an arch portion of the deflection element, wherein the arch portion is a region of an arched deformation of the deflection element, at which a tangent runs substantially at an angle to the drive element. As a result, an arched elastic deformation of the deflection element can be transferred to the connection element when the membrane is deflected. The arched deformation of the deflection element is related to a deflected state of the membrane. The connection element can be, for example, deformable with the same degree of deformation as the deflection element; for example a radius of the arched deformation of the connection element can have the same radius as the arched deformation of the arch portion of the deflection element to which the connection element is connected.

According to one example embodiment of the present invention, the connection element can have an arch region and a neutral region adjoining the arch region when there is an arched elastic deformation, wherein the connection element is connected to the drive element via the neutral region. In the neutral region, the twisting of the connection element transmitted from the deflection element to the connection element is minimized. For example, a twisting transmitted from the deflection element to the connection element can decrease along the connection element and reach a minimized deformation after a sufficient distance. For example, the connection element can merge vertically into the drive element at its neutral region or be connected vertically thereto. For example, the length of the connection element can therefore be dimensioned in such a way that the connection element merges into the drive element with little twist. This ensures that no twists are transferred from the deflection element to the drive element. In addition, the connection element prevents the deflection element and therefore possibly also the membrane from being stiffened. The low-twist connection of the connection element to the drive element can alternatively be achieved or additionally improved if the connection element is connected to the deflection element at a suitable position. This can be, for example, a position at which there is twisting of the deflection element when the membrane is deflected, wherein the connection element is configured such that the twisting transferred to the connection element is equal to the twisting of the deflection element at the connection point. This can make it possible to achieve a compensation for the twist, which allows the connection element to be connected to the drive element with little twist. In the case of a periodic arrangement of a plurality of membranes and a connection structure, the connection element can be connected to the deflection element, for example at a position of $\frac{1}{2}\pm15\%$ of the membrane distance or close to the coupling point, for example at a position of $\frac{1}{8}\pm10\%$ of the membrane distance. In principle, the connection can also be made to a low-twist portion of the deflection element if the plurality of membranes are arranged non-periodically or the displacement structure has only a single membrane, wherein the position is selected here according to the individual membrane arrangement such that the twisting transferred to the connection element is equal to the twisting of the deflection element at the connection point.

According to one example embodiment of the present invention, the device can have a connection structure group having connection structures arranged parallel to one another, which have a drive element and in each case a flexible deflection element connecting the membrane to the drive element. This allows a more uniform deflection of the membrane. The connection structure group can therefore, for example, jointly deflect the same membrane, wherein the deflection elements are connected to the membrane at different coupling points. The connection structure group can be driven in the same direction, i.e., can hence be displaced in the same direction of movement upon being driven by the drive apparatus. The connection structure group can be, for example, designed as a connection structure pair having two connection structures, but connection structure groups with more than two connection structures are also possible. The connection structures of the connection structure group can be designed as multiple connection structures in order to be able to deflect a plurality of membranes simultaneously so that the connection structure group can be designed as a multiple connection structure group. In a connection structure pair, the drive elements can be, for example, arranged between the deflection elements of the connection structure pair. The drive elements can also be designed as a common drive element of a connection structure group so that, for example, only one drive element having a plurality of, for example two, deflection elements can be formed in the connection structure group. If the deflection elements of the connection structures of the connection structure group are connected to the drive elements by means of rigid connection elements, the connection elements can be, for example, arranged opposite one another. In this way, residual transverse movement transferred from the connection elements to the connection structures can be directed in opposite directions and therefore at least partially compensated for. Alternatively, the connection elements can be arranged, for example, along the drive elements alternatingly at a position of $\frac{1}{4}\pm15\%$ and $\frac{3}{4}\pm15\%$ of the membrane distance. In this way, residual transverse movement transferred from the connection elements to the connection structures can be rectified and therefore be more effectively compensated for by the drive apparatus.

According to one example embodiment of the present invention, the device may comprise a first membrane, a second membrane and two connection structure groups having connection structures arranged parallel to one another, wherein a first connection structure group is connected to the first membrane, and a second connection structure group is connected to the second membrane. This allows the drive force to be distributed across a plurality of connection structure groups. In addition, improved displacement performance can be achieved. The high functional density also increases the cost-effectiveness of the device.

The first connection structure group can be driven in the opposite direction to the second connection structure group. This allows the first and second membranes to be deflectable in opposite directions so that an increased displacement performance can be achieved.

According to one example embodiment of the present invention, the connection structures of the first connection structure group can be arranged between the connection structures of the second connection structure group. This allows a uniform deflection of the first and second membranes to be achieved.

According to an alternative embodiment to the above-described design of the present invention, the connection structures of the first connection structure group and the connection structures of the second connection structure group can be arranged alternatingly one after the other. This allows the coupling points of the deflection elements on the membranes to be placed at different distances from each other, which allows different leverage effects and different stiffnesses of the membranes to be implemented so that greater design freedom is permitted.

According to one example embodiment of the present invention, a drive apparatus of the device can be designed to convert a residual transverse movement transferred from the drive element to the drive apparatus into a drive force acting on the drive element. For example, the residual transverse movement can be converted into a drive force by means of a transmission or lever mechanism. For example, connection structures or multiple connection structures can be driven relative to one another. The connection structures or multiple connection structures can also be drivable relative to a stator.

According to one example embodiment of the present invention, the connection element can have a higher flexural rigidity than the deflection element, the connection element can be connected to a neutral portion of the deflection element, the tangent of which at an arched deformation of the deflection element runs substantially parallel to the drive element, the device has a connection structure group having connection structures arranged parallel to one another, which have a drive element and in each case a deflection element connecting the membrane to the drive element, and the device has a first membrane, a second membrane and two connection structure groups having connection structures arranged parallel to one another, wherein a first connection structure group is connected to the first membrane, and a second connection structure group is connected to the second membrane. This makes it possible to provide a compact and efficient device with a high displacement capacity.

The device can be, for example, produced as a layered structure having a plurality of functional layers produced between two cover layers or wafers. For example, the membrane or membranes can be arranged in a first functional layer, and the connection structure or the connection structures can be arranged in a second functional layer. The second functional layer can be arranged above and/or below the first functional layer. The coupling points with which the membranes are connected to the connection structures can extend between the first and second functional layers and, for example, form an intermediate coupling layer. The membranes and/or the connection structures can advantageously be made of a semiconductor material such as silicon or silicon compounds.

The displacement structure of the device can be, for example, designed to compress and expand air so that the generated fluid pressure can be, for example, a sound pressure, and the device is suitable for use in an acoustic MEMS, for example a microelectromechanical loudspeaker. According to other exemplary embodiments, the displacement structure can be designed, for example, as a pump or a valve for microfluidic applications.

The present invention also relates to a microelectromechanical loudspeaker which has a microelectromechanical device according to at least one of the features described above, wherein the displacement structure is designed to generate sound pressure as fluid pressure, and which has a signal processing unit for applying and processing signals from the microelectromechanical device. Due to the elastically deformable deflection element of the connection structure of the loudspeaker device, a twisting of the membrane deflected by means of the deflection element is not hindered, and stiffening effects are avoided. This makes it possible to provide a microelectromechanical loudspeaker with a high and constant sound pressure level (SPL) over a wide frequency range, for example between 20 Hz and 20 kHz. In addition, a high sound quality is achieved for the loudspeaker, which can be represented, for example, by a low harmonic distortion (THD, total harmonic distortion).

In general, in the context of this application, the words "a/an", unless expressly defined otherwise, are not to be understood as numerals, but as indefinite articles with the literal meaning of "at least one".

The present invention allows for various embodiments and is explained in more detail below using an exemplary embodiment with the figures.

DETAILED DESCRIPTION OF EXAMPLE EMBODIMENTS

Figure 1A:
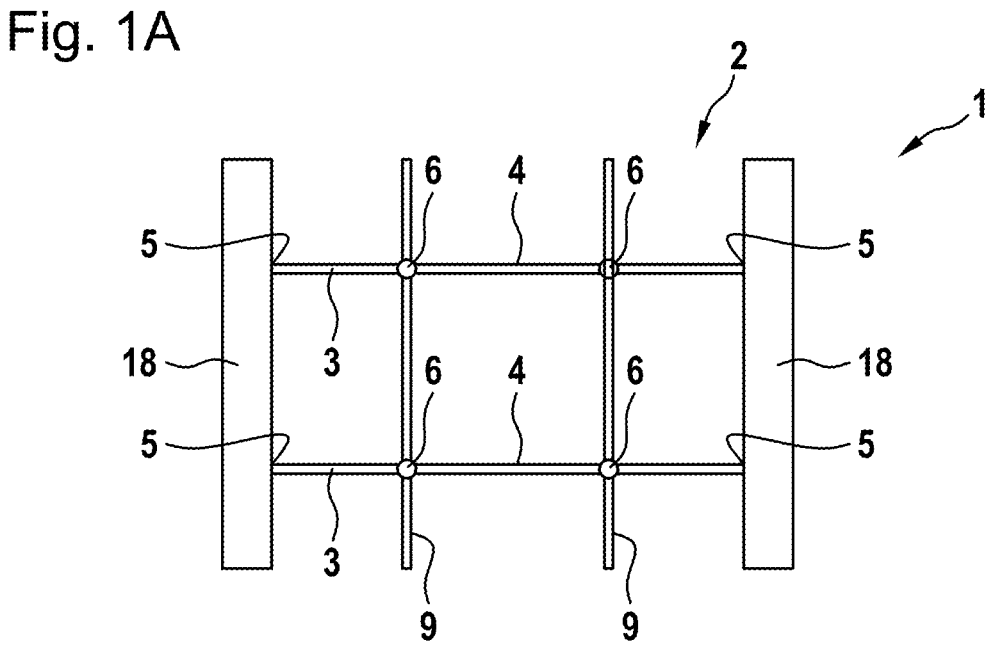
FIGS. 1A and 1B show a schematic basic principle of a membrane deflection by elastic deflection elements in a displacement structure of a microelectromechanical device, according to an example embodiment of the present invention.
Figure 1B:
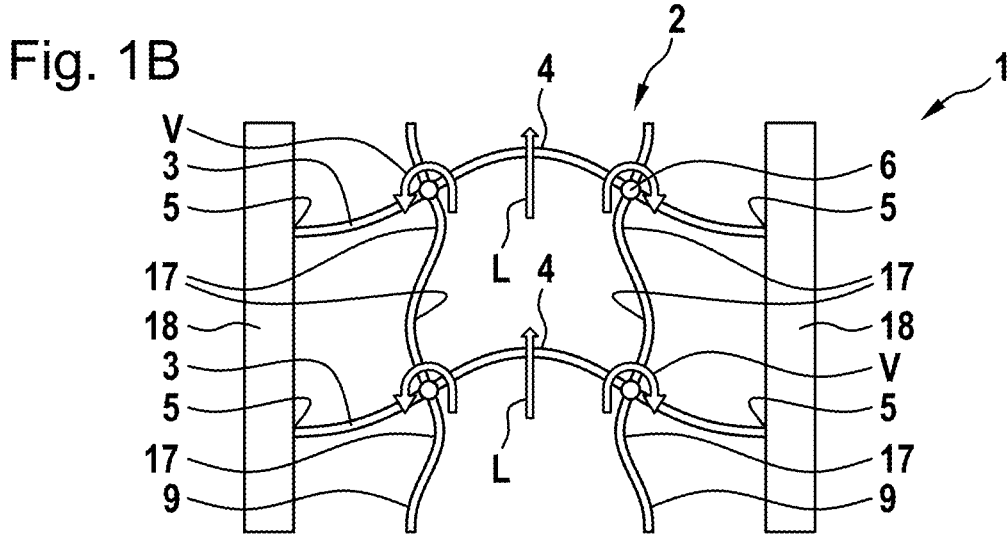
Figure 2A:
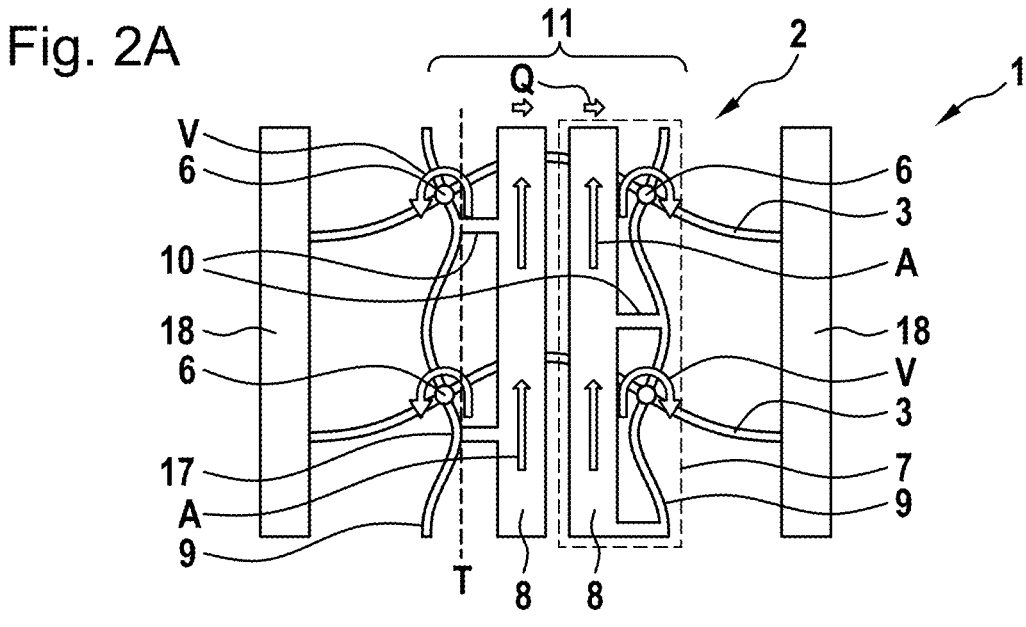
FIGS. 2A and 2B are schematic plan views of a microelectromechanical device having a displacement structure according to a first embodiment of the present invention.

FIGS. 1A and 1B schematically show a basic principle of a microelectromechanical device 1 having a displacement structure 2 that has a plurality of membranes 3 which can be deflected by means of elastically deformable deflection elements 9. FIGS. 1A and 1b are intended to first illustrate a basic principle of elastic deflection so that no drive element 8 has been drawn in here as can be seen in the following figures. FIG. 1A shows the membranes 3 in a non-deflected state, which can be referred to as the initial position. FIG. 1B shows the membranes 3 in a deflected state. FIGS. 1A and 1B represent a plan view of the displacement structure 2, the membranes 1 of which are aligned vertically in the displacement structure 2 so that the gaze of the viewer is directed toward a membrane edge delimiting the membrane plane. The membranes 3 are held by a frame-shaped holding structure 18. The membranes 3 were transferred from FIG. 1A to FIG. 1B from the initial position into the deflected state by a deflection movement L. According to the illustration, two arched, elastically deformable deflection elements 9 are connected to the membranes 3 via coupling points 6. The coupling points 6 are each located approximately in the middle between a membrane center 4 and a membrane end 5. By designing the deflection element 9 as an elastically deformable deflection element 9, a twist V of the membrane 3 is transmitted to the deflection element 9. This avoids stiffening of the membrane 3 at the coupling point 6 and reduces the stress on the membrane 3 from the deflection element 9. The twist V leads to a wave-shaped deformation of the deflection element 9 between the membranes 3. In this case, the deflection element 9 regularly has positions of a sign change of the twist V, at which a point with little twist, put simply a neutral portion 17, is present. Put simply, the neutral portion 17 runs approximately parallel to a drive element 8. FIG. 2A shows how an exemplary tangent T of the arched deformation can run substantially parallel to a drive element 8 of the displacement structure 2 at the neutral portion 17. The neutral portions 17 can represent advantageous positions for connecting a connection element 10 explained in the further figures for connecting the deflection element 9 to a drive element 8.

Figure 2B:
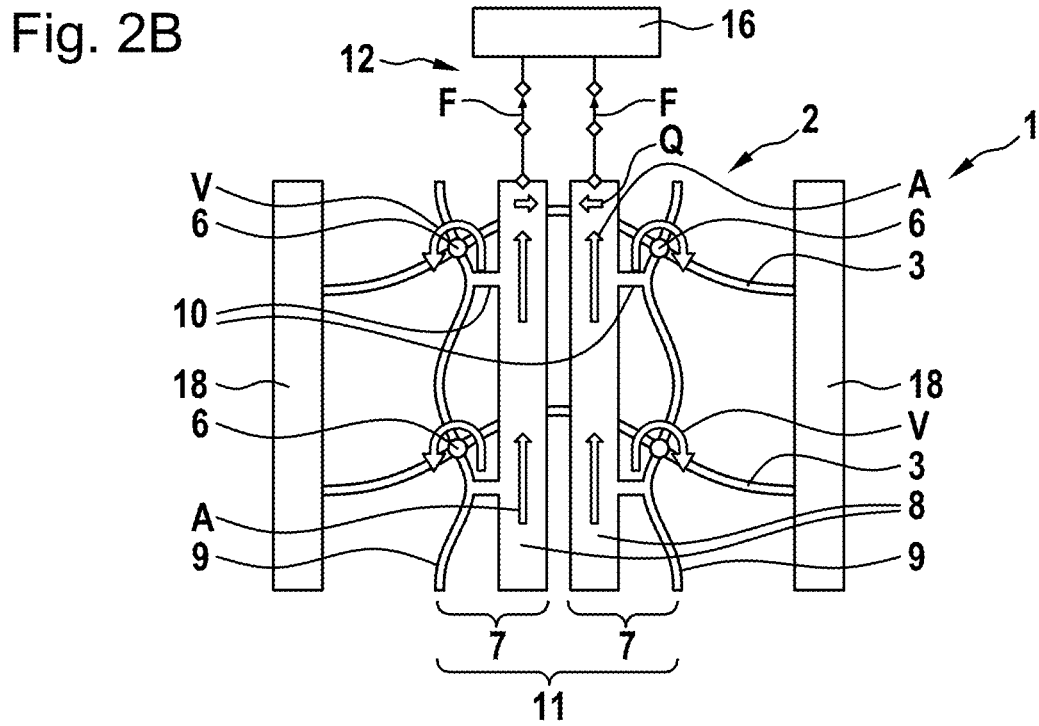

FIGS. 2A and 2B show a microelectromechanical device 1 for generating a fluid pressure according to a first embodiment. The device 1 has a displacement structure 2 having movable membranes 3 which enclose a variable displacement volume that can be filled with a fluid with the holding structures 18 and adjacent membranes 3 and can generate a fluid pressure by changing the displacement volume. The membranes 3 can be driven by means of connection structures 7 arranged parallel to one another, wherein the connection structures 7 according to the illustrated first embodiment are designed as a connection structure group 11 formed by a connection structure pair. The connection structures 7 are also designed as multiple connection structures so that each connection structure 7 is designed to deflect a plurality of membranes 3. The connection structure group 11 is therefore designed as a multiple connection structure group. The connection structures 7 can be driven in opposite directions so that the membranes 3 can be deflected from their initial position in opposite directions. Each connection structure 7 of the connection structure group 11 has a drive element 8 and a continuous deflection element 9, the flexural rigidity of which is lower than the flexural rigidity of the drive element 8. In other words, the drive element 8 is rigid, and the deflection element 9 is flexible. The drive element 8 and the deflection element 9 are connected here to one another via connection elements 10 which have a higher flexural rigidity than the deflection element 9, i.e., are rigid, put simply. In principle, it is also possible to combine the two drive elements 8 into one drive element 8 and to design them as a common drive element 8, as will be explained later. The connection structures 7 serve to transmit power from a drive apparatus 12, shown for example in FIG. 2B, having an optional stator 16, to the membrane 3. The drive elements 8 of the connection structures 7 are driven in the same direction by the drive apparatus 12 so that they execute a connection structure movement A in the same direction. By designing the drive elements 8 as drive elements 8 with a higher flexural rigidity than the deflection elements 9, a potential transfer of twists V to the drive apparatus 12 is avoided. A potential transfer of twists V to the drive apparatus 12 can also be avoided by designing the connection elements 10 as connection elements 10 with a higher flexural rigidity than the deflection elements 9.

As already explained in connection with FIGS. 1A and 1B, the connection elements 10 are connected to the deflection element 9 at neutral portions 17 thereof. This prevents the membrane 3 from being stiffened by the connection element 10. Put simply, the neutral portion 17 runs approximately parallel to a drive element 8. FIG. 2A shows how an exemplary tangent T of the arched deformation can run substantially parallel to a drive element 8 of the displacement structure 2 at the neutral portion 17. Viewed from top to bottom in FIG. 2A, the connection elements 10 of the connection structure group 11 are alternatingly connected to the deflection element 9 on both sides of the drive elements 8 at a position of approximately V and % of the distance between the membranes 3. This creates a slight, residual transverse movement Q of the drive elements 8 in the same direction, which can be compensated for by the drive apparatus 12. In FIG. 2B, the connection elements 10 are arranged opposite one another so that there is an opposing residual transverse movement Q in the drive elements 8 so that they can at least partially compensate for one another. A force F from the drive plane can act back on the drive apparatus 12. The residual transverse movements Q indicated by illustrations of arrows in the figures represent a momentary direction of movement due to the existing deflection of the membranes 3. If there is an opposite drive direction of the connection structures 7, the movement directions of the residual transverse movements Q can be opposite.

Figure 3A:
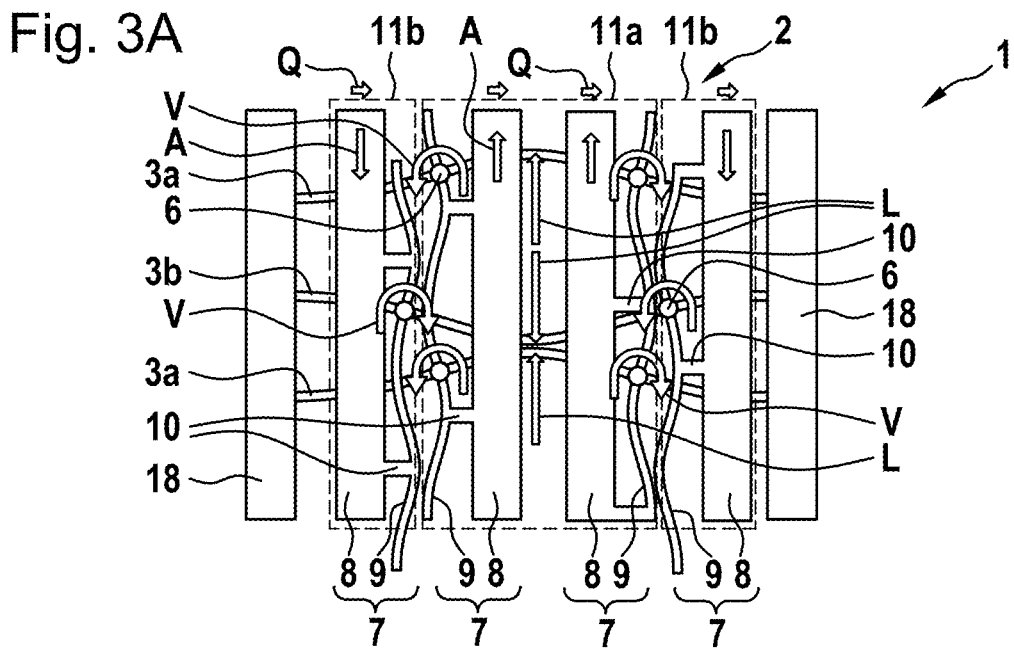
FIGS. 3A and 3B are schematic plan views of a microelectromechanical device having a displacement structure according to a second embodiment of the present invention.
Figure 3B:
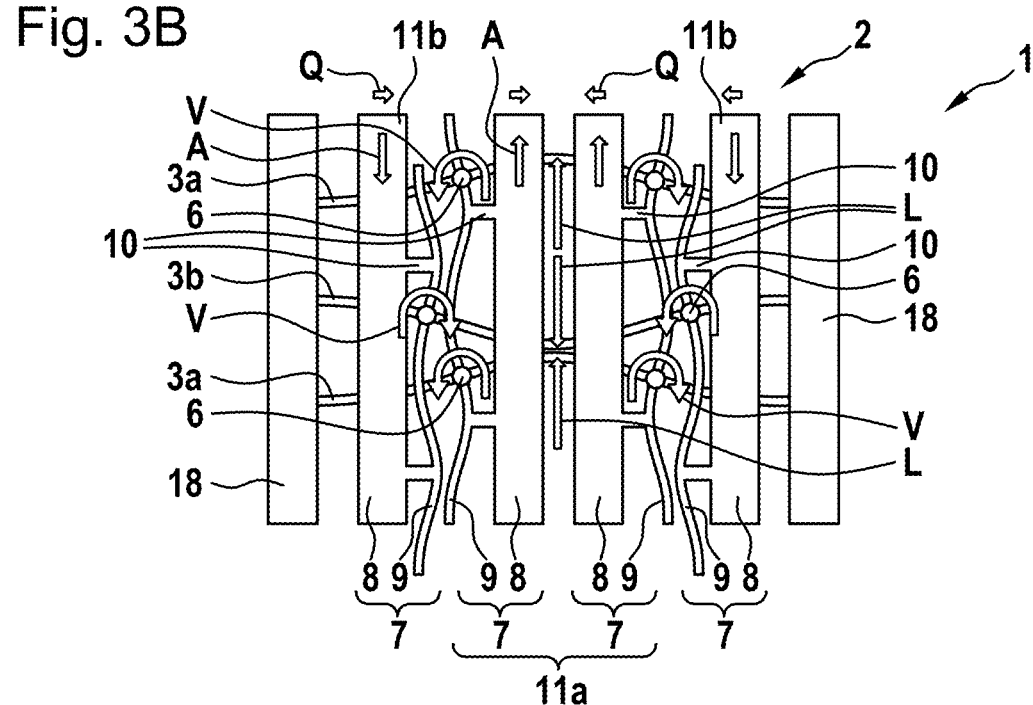

FIGS. 3A and 3B show a microelectromechanical device 1 for generating a fluid pressure according to a second embodiment. In its basic structure and functional principle, the shown displacement structure 2 is comparable to the displacement structure 2 of the device 1 according to the first embodiment. However, the displacement structure 2 according to FIGS. 3A and 3B has a first connection structure group 11a and a second connection structure group 11b, wherein the first connection structure group 11a is connected to first membranes 3a, and the second connection structure group 11b is connected to a second membrane 3b. The first connection structure group 11a can be driven in the opposite direction to the second connection structure group 11b so that the connection structure movements A of the connection structures 7 of the connection structure group 11a, 11b can take place in opposite directions. This can allow an opposing deflection movement L of the first membranes 3a and the second membrane 3b. Viewed from top to bottom in FIG. 3A, the connection elements 10 of the connection structure groups 11a, 11b are each alternatingly connected to the deflection element 9 at a position of approximately ¼ and ¾ of the distance between the first membranes 3a and the second membrane 3b and a further second membrane (not shown in detail). This creates a slight, residual transverse movement Q of the drive elements 8 in the same direction, which can be compensated for by the drive apparatus 12. In FIG. 3B, the connection elements 10 are arranged opposite one another, so that an opposing residual transverse movement Q is present in the drive elements 8 of each connection structure group 11a, 11b, so that they can already at least partially compensate for one another. The connection structure groups 11a, 11b are configured such that the connection structures 7 of the first connection structure group 11a are arranged between the connection structures 7 of the second connection structure group 11b.

Figure 4A:
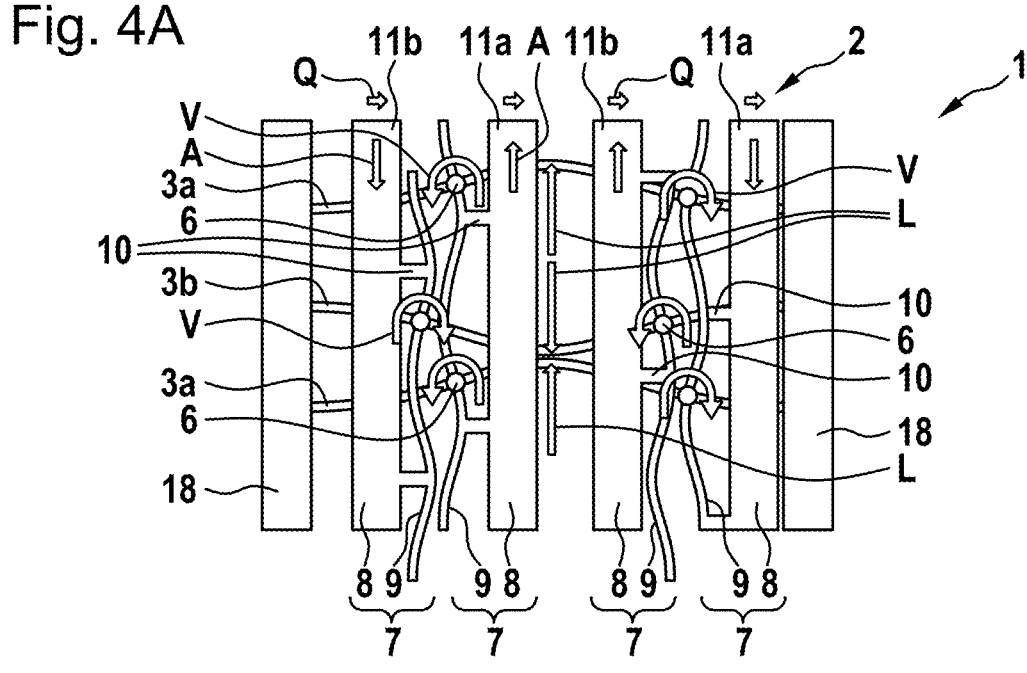
FIGS. 4A and 4B are schematic plan views of a microelectromechanical device having a displacement structure according to a third embodiment of the present invention.
Figure 4B:
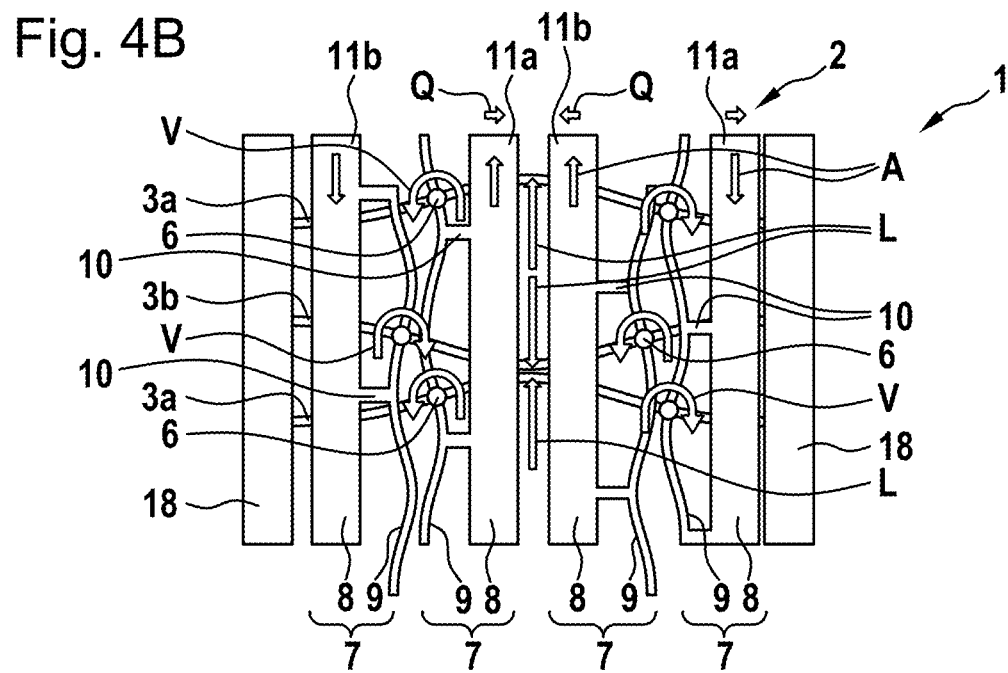

FIGS. 4A and 4B show a microelectromechanical device 1 for generating a fluid pressure according to a third embodiment. In its basic structure and functional principle, the displacement structure 2 shown is comparable to the displacement structure 2 of the device 1 according to the second embodiment. However, it is shown here that the connection structures 7 of the first connection structure group 11a and the connection structures 7 of the second connection structure group 11b can be arranged alternatingly one after the other. As a result, the coupling points 6 of the deflection elements 9 on the first membranes 3a and the second membranes 3b can be placed at different distances from each other in order to achieve different leverage effects and stiffnesses of the membranes 3a, 3b.

Figure 5A:
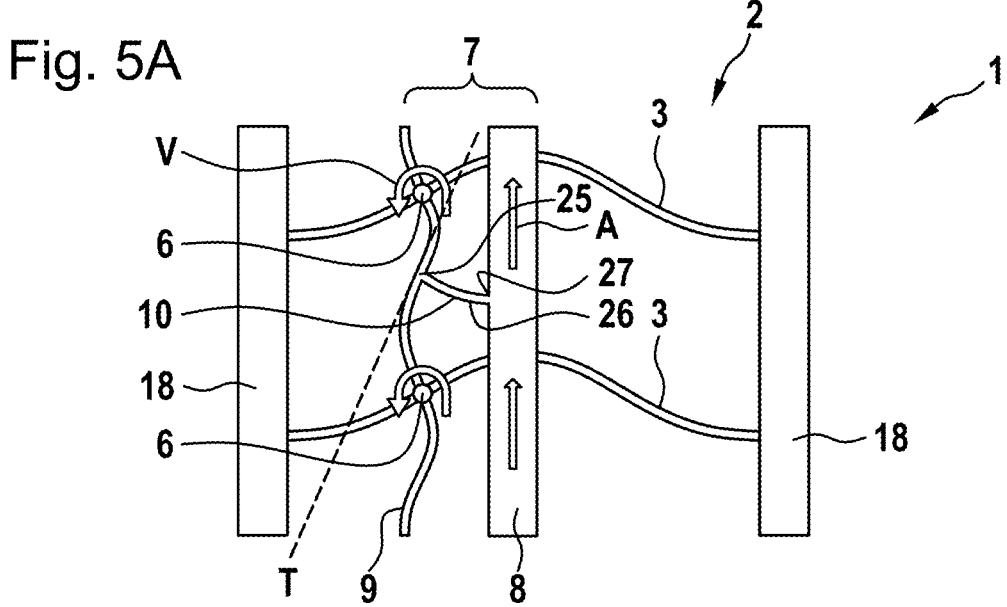
FIGS. 5A and 5B are schematic plan views of a microelectromechanical device having a displacement structure according to a fourth embodiment of the present invention in two variants.
Figure 5B:
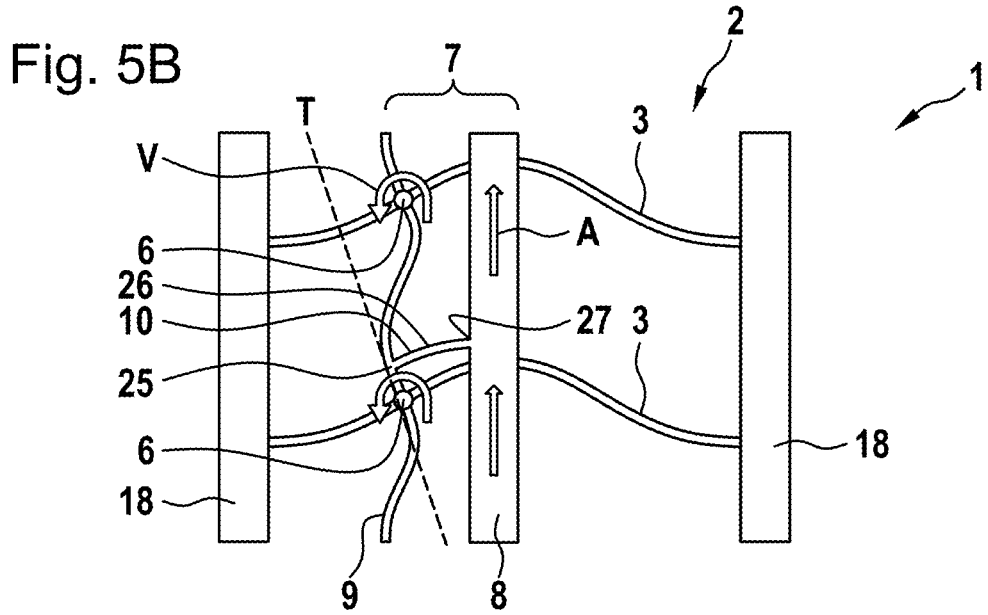

FIGS. 5A and 5B show a microelectromechanical device 1 for generating a fluid pressure according to a fourth embodiment in two variants. The illustrated displacement structure 2 of the device 1 has a single connection structure 7 having a drive element 8 and a deflection element 9 which are connected to one another via a connection element 10, the flexural rigidity of which is lower than the flexural rigidity of the drive element 8. In other words, the connection element 10 is flexible. The flexible connection element 10 is elastically deformable in an arc shape so that a twist V of the membrane 3 can be transferred to the connection element 10 via the deflection element 9. In this way, stiffening of the membrane 3 can be further reduced or avoided. The connection of the flexible connection element 10 to the deflection element 9 can, as shown, be made for example approximately centrally between the membranes 3 (FIG. 5A) or close to a coupling point 6 (FIG. 5B). The deflection element 9 is elastically deformable in an arc shape as shown. The connection element 10 is connected to an arch portion 25 of the deflection element 9. The arch portion 25 is a region of an arched deformation of the deflection element 9 at which a tangent T runs substantially at an angle to the drive element 8, as shown in FIGS. 5A and 5B. As a result, the flexible connection element 10 is connected to the drive element 8 with little twist since the selected connection point of the connection element 10 causes the twist V of the connection element 10 in a deflected state of the membrane 3 to approximately correspond to the twist V of the deflection element 9 at the connection point. In this way, at least partial compensation of the twist V up to the connection point of the connection element 10 to the drive element 8 can be achieved. The connection element 10 has an arch region 26 and a neutral region 27 adjoining the arch region 26. The connection element 10 is connected to the drive element 8 via the neutral region 27. This also reduces or prevents the transfer of a twist V to the drive element 8.

Figures 6, 7A:
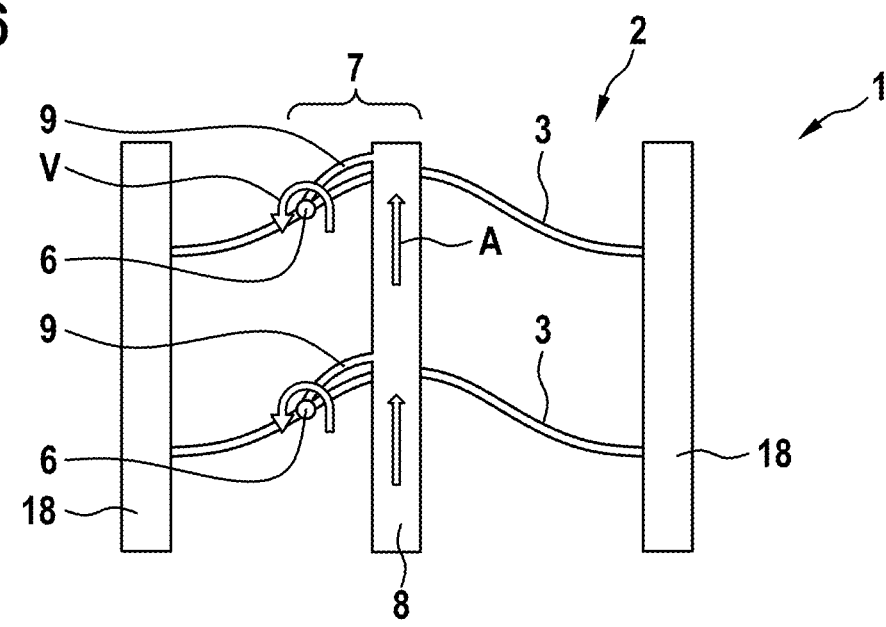
FIG. 6 is a schematic plan view of a microelectromechanical device having a displacement structure according to a fifth embodiment of the present invention.
FIGS. 7A and 7B are schematic plan views of a microelectromechanical device having a displacement structure according to a sixth embodiment of the present invention.

FIG. 6 shows a microelectromechanical device 1 for generating a fluid pressure according to a fifth embodiment. In this embodiment, the deflection element 9 of the connection structure 7 is not designed as a continuous deflection element 9 connected to the drive element 8 by means of connection elements 10, but the drive element 8 has a separate flexible deflection element 9 for each membrane 3, which is directly connected to the drive element 8. This makes it possible to provide a particularly compact drive solution with a simple displacement structure 2. The deflection elements 9 have a sufficiently selected length or a sufficient distance from the coupling point 6 to the drive element 8 in order to compensate for a twist V transferred from the deflected membrane 3 to the deflection element 9 up to the connection point to the drive element 8.

Figure 7B:
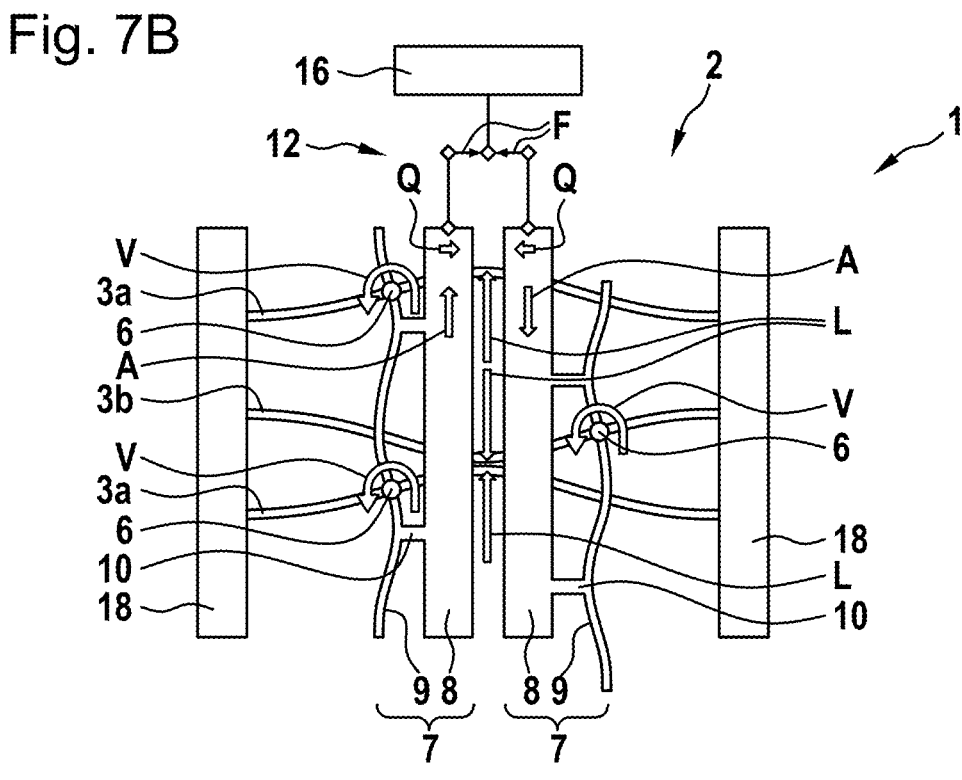
Figure 8:
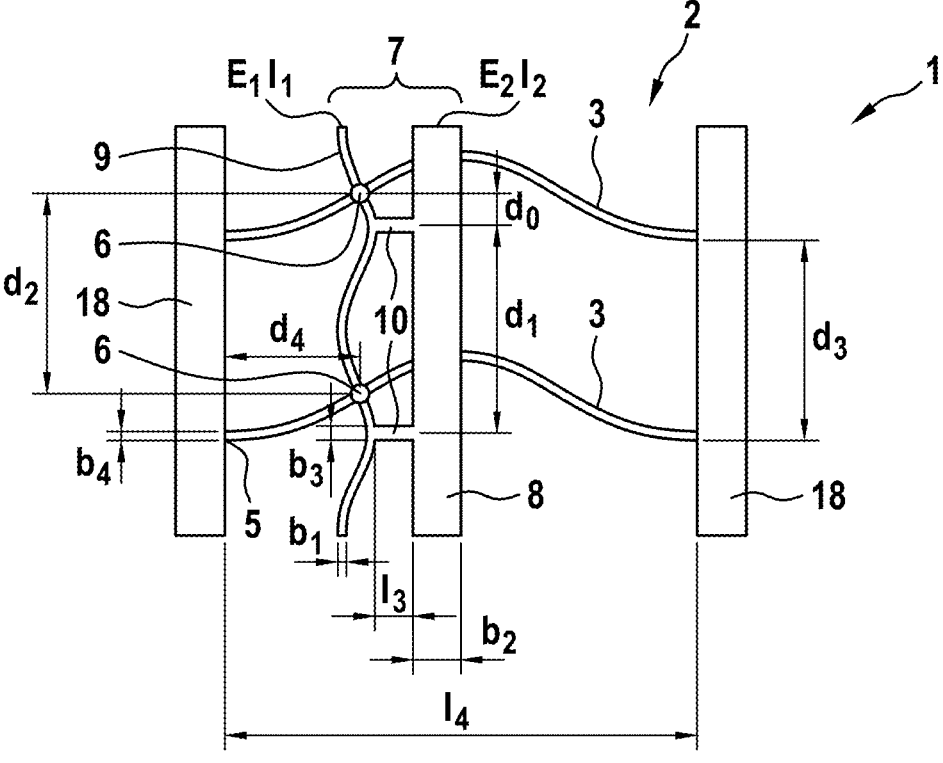
FIG. 8 is a schematic plan view of a microelectromechanical device having a displacement structure according to a seventh embodiment with geometric references, according to the present invention.

FIGS. 7A and 7B show a microelectromechanical device 1 for generating a fluid pressure according to a sixth embodiment. In its basic structure and functional principle, the shown displacement structure 2 is comparable to the displacement structure 2 of the device 1 according to the second embodiment, wherein however instead of connection structure groups 11a, 11b, individual connection structures 7 that can be driven in opposite directions are implemented. The drive apparatus 12 of the device 1 according to FIGS. 7A and 7B is designed in this case to convert a residual transverse movement Q transferred from the drive elements 8 to the drive apparatus 12 into a drive force acting on the drive elements 8. The direction of the force coincides with the direction of the residual transverse movement Q. This makes it possible generate a leverage effect which transforms small strokes with large forces in the drive elements 8 into large strokes on the membranes 3. FIG. 7A shows a device 1 having a drive force between the connection structures 7 without a stator, while FIG. 7B shows a device 1 having a drive force between the connection structures 7 and a stator 16. FIG. 8 is a schematic plan view of a microelectromechanical device 1 having a displacement structure 2 according to a seventh embodiment with geometric references. Accordingly, examples of lengths, widths, distances and flexural rigidities shown in the figure are given below to illustrate the dimensions of the microelectromechanical device 1 using an exemplary embodiment, and to be able to relate them to one another. In its basic structure and functional principle, the displacement structure 2 shown is comparable to the displacement structure 2 of the device 1 according to the first embodiment, although for reasons of clarity, only one connection structure 7 is shown. The deflection element 9 has a first flexural rigidity $E_1I_1$ which is composed of the product of the modulus of elasticity $E_1$ and the area moment of inertia $I_1$ of the deflection element 9. The drive element 8 has a second flexural rigidity $E_2I_2$ which is composed of the product of the modulus of elasticity $E_2$ and the area moment of inertia $I_2$ of the drive element 8. Due to the geometric design of the deflection element 9 and the drive element 8, illustrated here as a narrow deflection element 9 and a wide drive element 8, the second flexural rigidity $E_2I_2$ of the drive element 8 is higher than the first flexural rigidity $E_1I_1$ of the deflection element 9. As a result, the deflection element 9 is elastically deformable, in contrast to the drive element 8. Here, the modulus of elasticity $E_1$ or $E_2$ is to be understood as the effective modulus of elasticity, since the components of the displacement structure 2 of the device 1 can be made of anisotropic silicon and therefore local modulus of elasticity fluctuations can occur. Suitable or favorable value ranges of the effective modulus of elasticity $E_1$ or $E_2$ can be, for example, between 1 GPa and 400 GPa, in particular in a range between 120 GPa and 200 GPa. As schematically indicated in FIG. 8, the width $b_1$ of the deflection element 9 can be smaller than the width $b_2$ of the drive element 8. The deflection element 9 can, for example, have a width $b_1$ between 0.5 and 100 μm, in particular between 1 and 50 μm. The drive element 8 can, for example, have a width $b_2$ between 0.5 and 1500 μm, in particular between 50 and 500 μm. The drive element 8 and the deflection element 9 are connected to each other via connection elements 10. The connection element 10 can, for example, have a width $b_3$ between 0.5 and 100 μm, in particular between 1 and 30 μm. The connection element 10 can, for example, have a length $l_3$ between 0.5 and 500 μm, in particular between 6 and 100 μm. The membrane 3 can, for example, have a width $b_4$ between 0.5 and 100 μm, in particular between 1 and 30 μm. The membrane 3 can, for example, have a length $l_4$ between 100 and 10,000 μm, in particular between 1,000 and 5,000 μm. A distance $d_1$ between two connection elements 10 can be, for example, between 5 and 4500 μm, in particular between 10 and 200 μm. A distance do between a coupling point 6 and the nearest connection element 10 can be, for example, between 5 and 4500 μm, in particular ¼ of the distance $d_1$ between two connection elements 10. A distance $d_2$ between two coupling points 6 can be, for example, between 5 and 4500 μm, in particular between 10 and 200 μm. A distance $d_3$ between two membranes 3 can be, for example, between 5 and 4500 μm, in particular between 10 and 200 μm. According to one exemplary embodiment, the distances $d_1$, $d_2$ and $d_3$ may be substantially equal. A distance $d_4$ between a membrane end 5 of a membrane 3 and a coupling point 6 on the same membrane 3 can be, for example, between $0.01 \cdot (l_4/2)$–$0.99 \cdot (l_4/2)$.

Figures 9A, 9B:
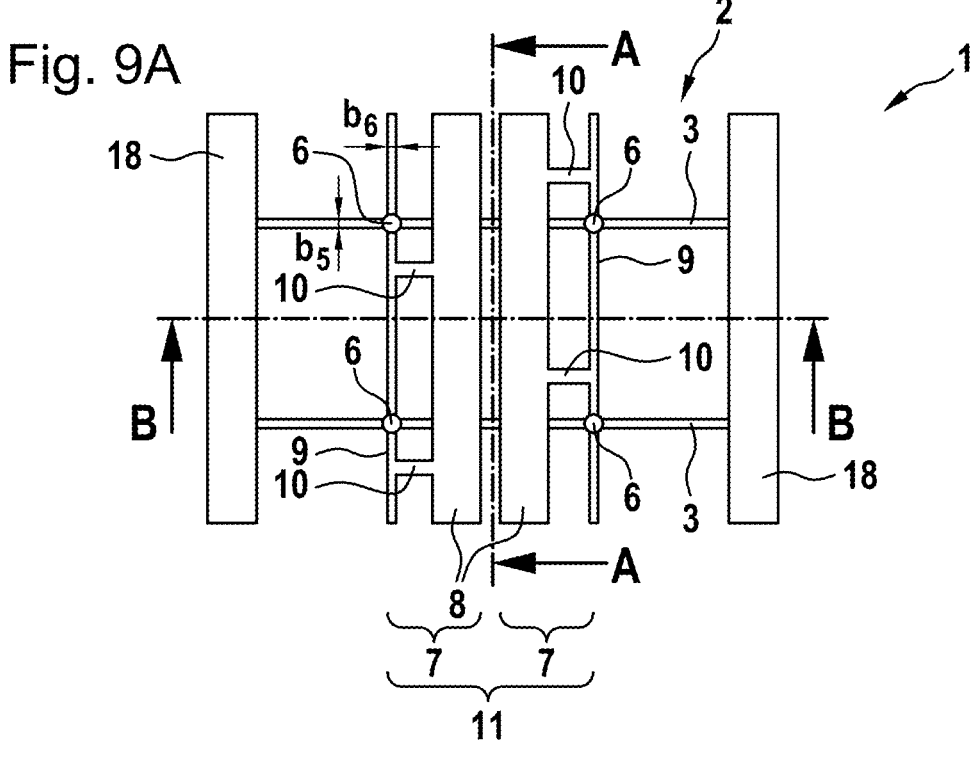
FIGS. 9A-9D are schematic plan views and cross-sectional views of the microelectromechanical device having a displacement structure according to the first embodiment of the present invention.
Figures 9C, 9D:
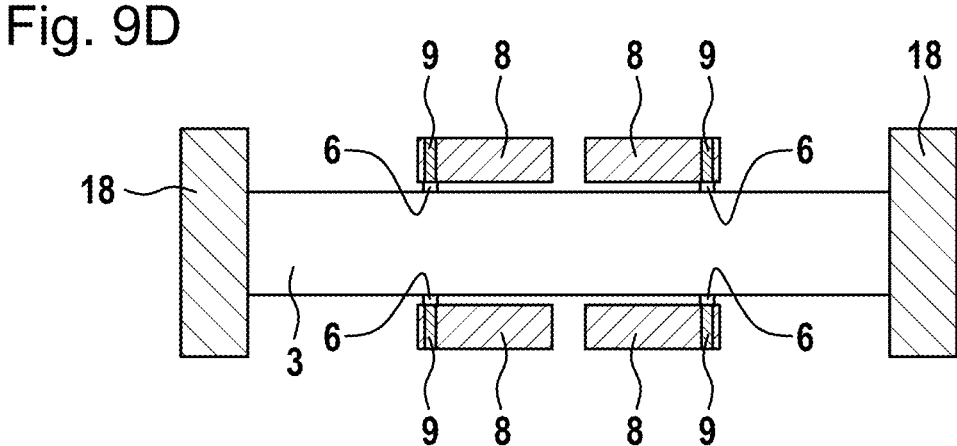

FIGS. 9A to 9D are schematic plan views and cross-sectional views of the microelectromechanical device 1 having a displacement structure 2 according to the first embodiment in a non-deflected state of the membranes 3. FIG. 9A is a plan view, FIG. 9B a side cross-sectional view along the section line AA, FIG. 9C a sectional front view along the section line BB, and FIG. 9D an alternative embodiment to the embodiment in FIG. 9C. FIG. 9A can be viewed analogously to FIG. 2A, wherein in this case, the connection structures 7 are not driven, the membranes 3 are not deflected, and the deflection elements 9 are accordingly not elastically deformed. In FIG. 9B, the connection structure plane with the drive element 8 is visible in the left part of the image, followed by the coupling point plane with the coupling point 6 and the membrane plane with the membrane 3 in the right part of the image, with the holding structure 18 being visible in the background. In FIG. 9C, the spanned membrane plane of the membrane 3 can be seen, wherein the coupling points 6 are shown on the membrane edge as the outer boundary of the membrane plane between the holding structures 18, via which the membrane 3 is connected to the deflection elements 9, which in turn are connected to the drive elements 8. While in FIG. 9C, a connection structure plane above the membrane plane is shown as an example, which in other exemplary embodiments can also be positioned below the membrane plane, according to FIG. 9D, a connection structure plane with an analogous structure can also be provided above and below the membrane plane in each case. A width $b_5$ and a thickness be of the coupling point 6 shown in FIG. 9A can, for example, in each case be between 0.5 and 100 μm, wherein the width $b_5$ can in particular be half of a width $b_4$ of the membrane 3 and wherein the thickness be can in particular be half of the width $b_1$ of the deflection element 9. The height $h_1$ of the drive element 8 and/or of the deflection element 9 indicated in FIG. 9C can be, for example, between 0.5 and 600 μm, in particular between 5 and 60 μm. A height $h_2$ of the coupling point 6 can be between 0.01 μm and 20 μm, in particular between 0.1 and 3 μm. A height $h_3$ of the membrane 3 can be, for example, between 1 and 2000 μm, in particular between 50 and 800 μm.

Figure 10A:
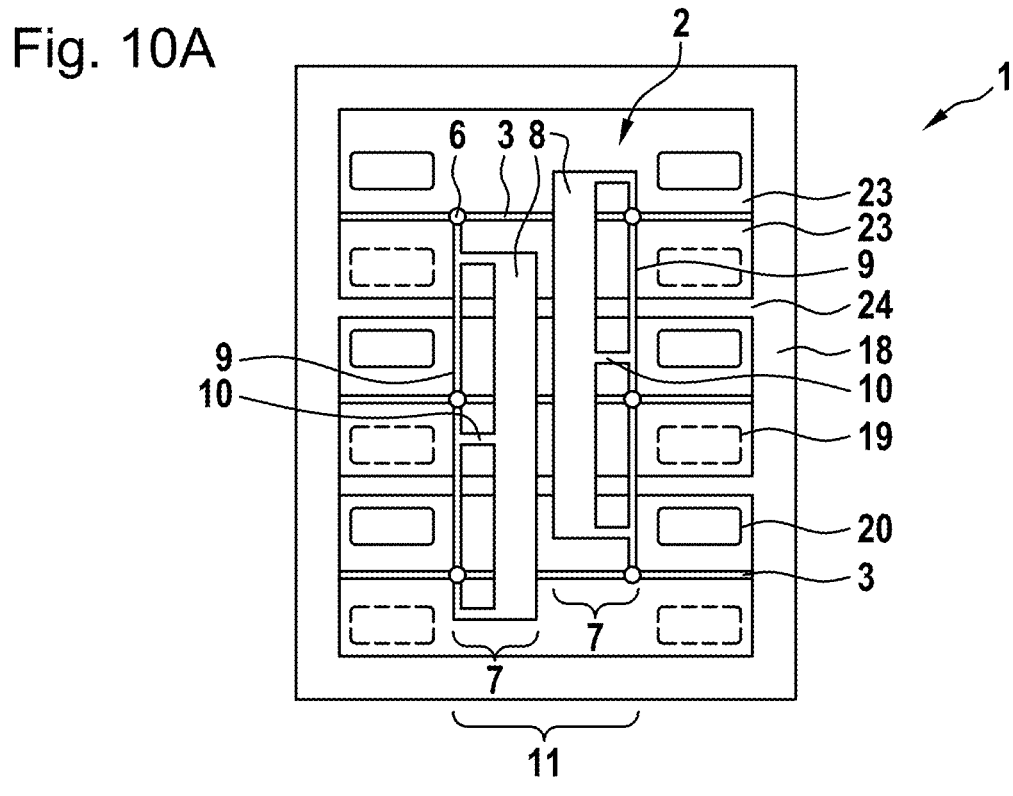
FIGS. 10A and 10B are schematic plan views of a microelectromechanical device having a displacement structure according to an eighth embodiment of the present invention.
Figure 10B:
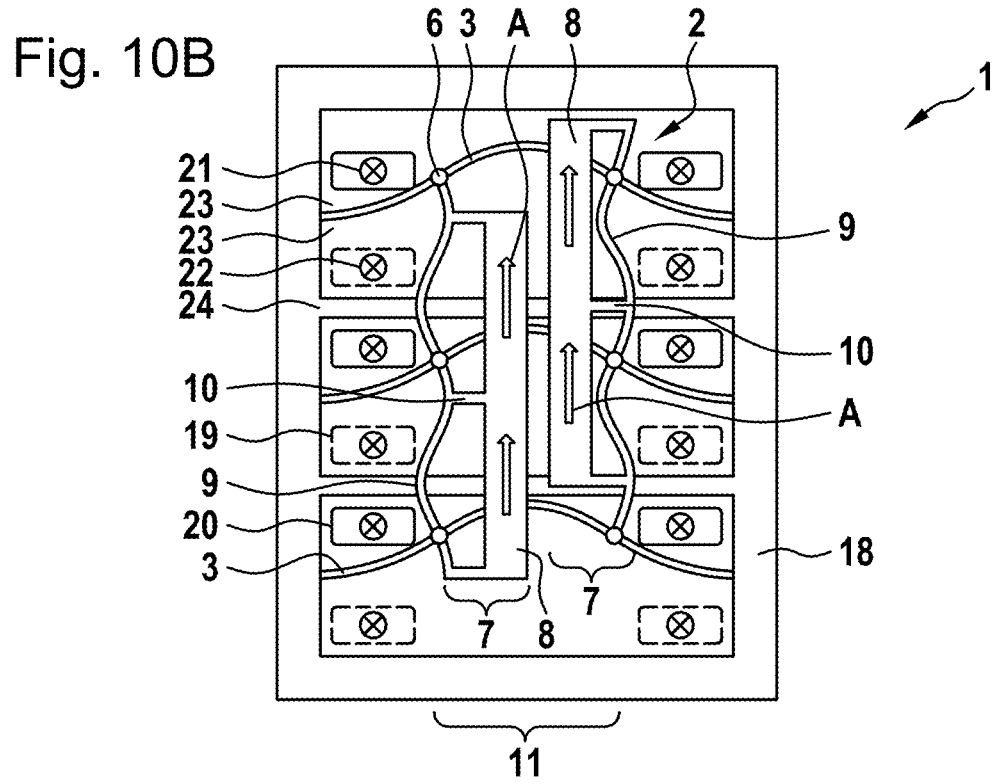

FIGS. 10A and 10B are schematic plan views of a microelectromechanical device 1 having a displacement structure 2 according to an eighth embodiment. In FIG. 10A, the membranes 3 are shown in their initial position, in FIG. 10B, in their deflected state. In its basic structure and functional principle, the shown displacement structure 2 is comparable to the displacement structure 2 of the device 1 according to the first embodiment. The holding structure 18 is shown here as a surrounding frame having chamber partition walls 24 which separate an independent fluid chamber 23 for each shown membrane 3. Cover openings 19 and bottom openings 20 are introduced into the fluid chambers 23 to allow fluid flows to enter and exit the fluid chambers 23. This is sketched in FIG. 10B by means of illustrated fluid outlets 21 through the cover openings 19 and fluid inlets 22 through the bottom openings 20 according to the illustrated connection structure movement A and the deflection of the membranes 3.

Figure 11A:
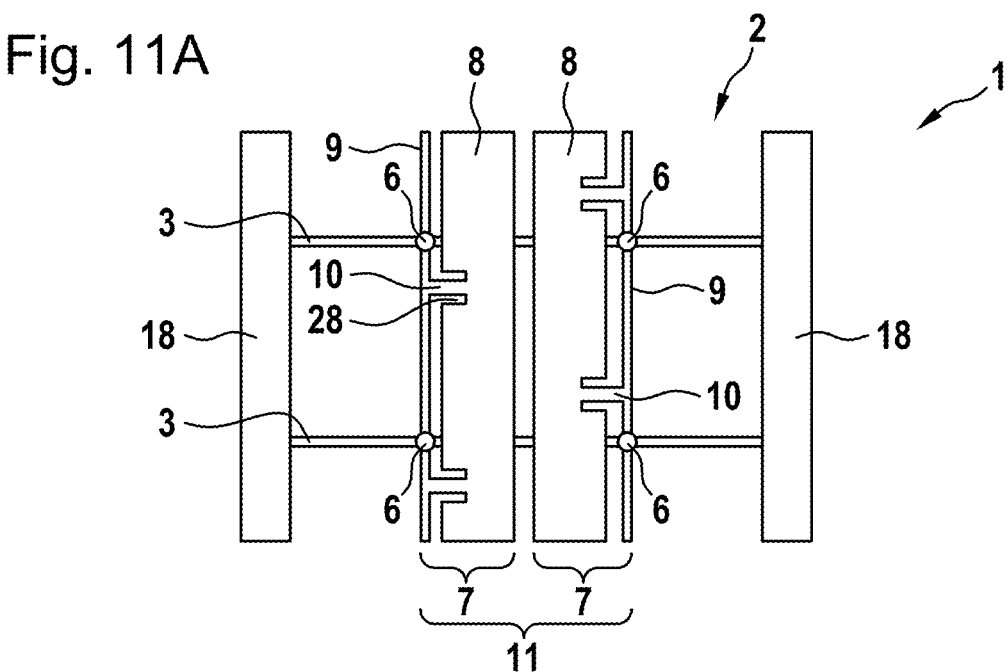
FIGS. 11A and 11B are schematic plan views of a microelectromechanical device having a displacement structure according to a ninth embodiment of the present invention in two variants.
Figure 11B:
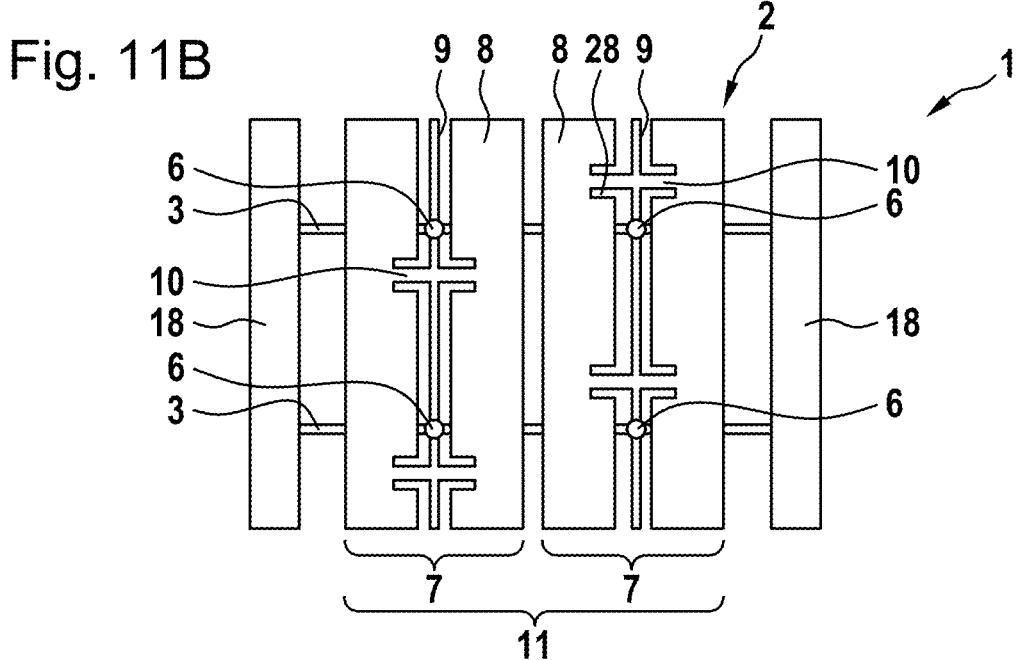

FIGS. 11A and 11B are schematic plan views of a microelectromechanical device 1 having a displacement structure 2 according to a ninth embodiment in two variants. The membranes 3 are shown in a non-deflected state. In its basic structure and functional principle, the shown displacement structure 2 is comparable to the displacement structure 2 of the device 1 according to the first embodiment. However, in this embodiment, the connection elements 10 partially penetrate into a recess 28 in the drive elements 8. This makes it possible to provide a compact embodiment of the connection structures 7. FIG. 11B shows that two drive elements 8 can also have a common deflection element 9 and at least one common connection element 10. This makes it possible for a stable and safe drive of the deflection element 9 with a compact embodiment to be achieved.

Figure 12A:
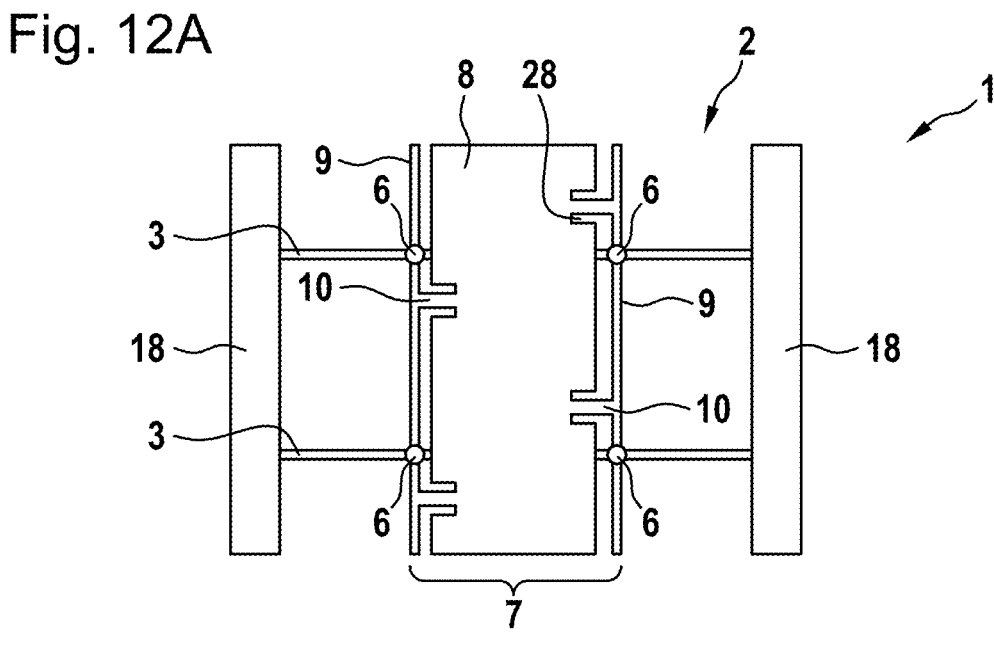
FIGS. 12A and 12B are schematic plan views of a microelectromechanical device having a displacement structure according to a tenth embodiment of the present invention in two variants.
Figure 12B:
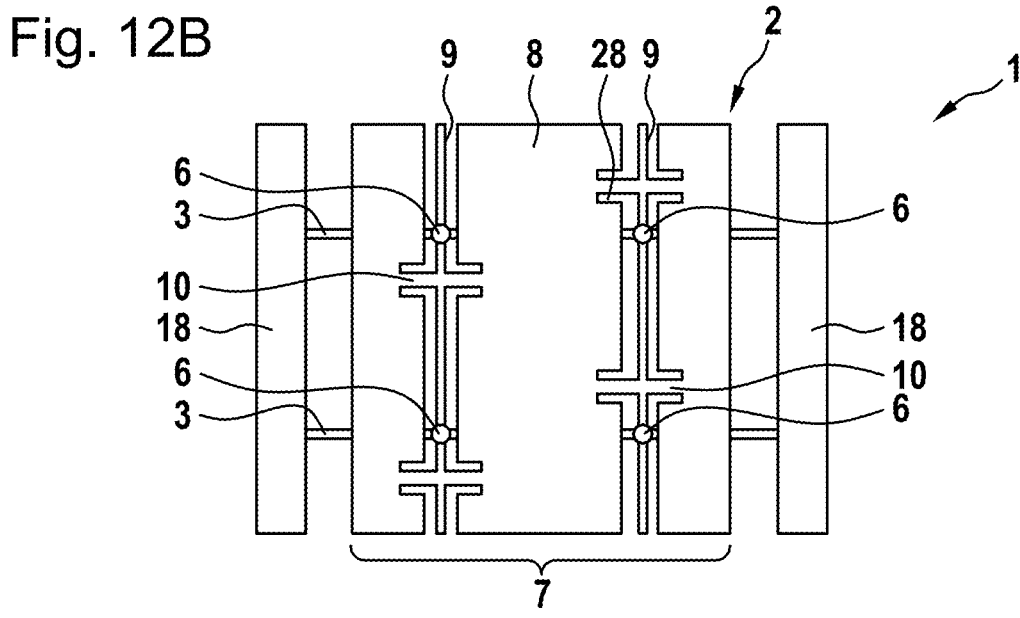

FIGS. 12A and 12B are schematic plan views of a microelectromechanical device 1 having a displacement structure 2 according to a tenth embodiment in two variants. The membranes 3 are shown in a non-deflected state. In its basic structure and functional principle, the displacement structure 2 shown is comparable to the displacement structure 2 of the device 1 according to the ninth embodiment. In this case, however, the connection structures 7 previously shown with two separate drive elements 8 are designed such that there is a common drive element 8 for two deflection elements 9 connected to the drive element 8. This also makes it possible for a stable and safe drive of the deflection element 9 in a compact embodiment to be achieved. In FIG. 12B, such a common drive element 8 is shown in addition to two outer drive elements 8, wherein the common drive element 8 and one outer drive element 8 each enclose a common deflection element 9 and are connected via common connection elements 10.

Figure 13:
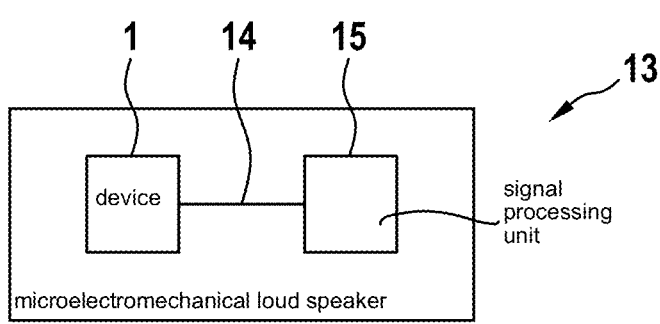
FIG. 13 shows a schematic diagram of a microelectromechanical loudspeaker having a microelectromechanical device, according to an example embodiment of the present invention.

FIG. 13 schematically shows a microelectromechanical loudspeaker 13 having a device 1 according to the above-described features and a signal processing unit 15 which is connected to the device 1 by a signal connection 14 and is designed to apply and process signals from the microelectromechanical device 1. The displacement structure 2 of the device 1 is designed to generate sound pressure as fluid pressure. The elastic deflection element 9 of the connection structures 7 of the device 1 of the loudspeaker 13 prevents the membrane 3 from stiffening. The microelectromechanical loudspeaker 13 can be, for example, implemented as a system-on-chip.

What is claimed is:

1. A microelectromechanical device for generating a fluid pressure, comprising:
   a displacement structure, the displacement structure including a movable membrane which can be deflected to generate the fluid pressure via a drivable connection structure acting on the membrane, and wherein the connection structure includes a drive element and a deflection element connecting the membrane to the drive element, wherein the deflection element has a lower flexural rigidity than the drive element and is elastically deformable when the membrane is deflected.

2. The device according to claim 1, wherein the flexural rigidity of the drive element is at least five times the flexural rigidity of the deflection element.

3. The device according to claim 1, wherein the drive element is connected to the deflection element by a connection element.

4. The device according to claim 3, wherein the connection element has a higher flexural rigidity than the deflection element.

5. The device according to claim 4, wherein the deflection element is elastically deformable in an arc shape, and wherein the connection element is connected to a neutral portion of the deflection element, wherein the neutral portion is a region of an arched deformation of the deflection element at which a tangent runs substantially parallel to the drive element.

6. The device according to claim 3, wherein the connection element has a lower flexural rigidity than the drive element.

7. The device according to claim 6, wherein the deflection element is elastically deformable in an arc shape and wherein the connection element is connected to an arch portion of the deflection element, wherein the arch portion is a region of an arched deformation of the deflection element at which a tangent runs substantially at an angle to the drive element.

8. The device according to claim 7, wherein the connection element has an arch region and a neutral region adjoining the arch region when there is elastic deformation, and wherein the connection element is connected to the drive element via the neutral region.

9. The device according to claim 1, wherein the device further comprises a connection structure group having connection structures arranged parallel to one another, which have a drive element and in each case a deflection element connecting the membrane to the drive element.

10. The device according to claim 1, wherein the device further comprises a first membrane, a second membrane, and two connection structure groups having connection structures arranged parallel to one another, wherein a first connection structure group is connected to the first membrane and a second connection structure group is connected to the second membrane.

11. The device according to claim 10, wherein the connection structures of the first connection structure group are arranged between the connection structures of the second connection structure group.

12. The device according to claim 10, wherein the connection structures of the first connection structure group and the connection structures of the second connection structure group are arranged alternatingly one after the other.

13. The device according to claim 1, wherein the device further comprises a drive apparatus which is configured to convert a residual transverse movement transferred from the drive element to the drive apparatus into a drive force acting on the drive element.

14. The device according to claim 3, wherein:

the connection element has a higher flexural rigidity than the deflection element, the connection element is connected to a neutral portion of the deflection element, wherein the neutral portion is a region of an arched deformation of the deflection element at which a tangent runs substantially parallel to the drive element, the device further comprises a connection structure group having connection structures arranged parallel to one another, which have a drive element and in each case a deflection element connecting the membrane to the drive element, and the device further comprises a first membrane, a second membrane and two connection structure groups having connection structures arranged parallel to one another, wherein a first connection structure group is connected to the first membrane and a second connection structure group is connected to the second membrane.

15. A microelectromechanical loudspeaker, comprising:

a microelectromechanical device for generating a fluid pressure, including:

a displacement structure, the displacement structure including a movable membrane which can be deflected to generate the fluid pressure via a drivable connection structure acting on the membrane, and wherein the connection structure includes a drive element and a deflection element connecting the membrane to the drive element, wherein the deflection element has a lower flexural rigidity than the drive element and is elastically deformable when the membrane is deflected, wherein the displacement structure is configured to generate sound pressure as the fluid pressure; and a signal processing unit configured to apply and process signals from the microelectromechanical device.

* * * * *